US012693074B2

(12) United States Patent
Kim et al.

(10) Patent No.: US 12,693,074 B2
(45) Date of Patent: Jul. 28, 2026

(54) HEAT TREATMENT DEVICE AND METHOD OF MANUFACTURING DISPLAY PANEL USING THE SAME

(71) Applicant: Samsung Display Co., Ltd., Yongin-si (KR)

(72) Inventors: Minsu Kim, Yongin-si (KR); Dong-Wook Song, Yongin-si (KR); Hongrok Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 430 days.

(21) Appl. No.: 18/132,654

(22) Filed: Apr. 10, 2023

(65) Prior Publication Data

US 2023/0366627 A1     Nov. 16, 2023

(30) Foreign Application Priority Data

May 10, 2022     (KR) ........................ 10-2022-0056941

(51) Int. Cl.
| | |
|---|---|
| *F27D 7/02* | (2006.01) |
| *B05B 1/00* | (2006.01) |

(Continued)

(52) U.S. Cl.
CPC .................. *F27D 7/02* (2013.01); *F27B 5/16* (2013.01); *F27D 9/00* (2013.01); *H10K 71/00* (2023.02);

(Continued)

(58) Field of Classification Search
CPC ........ F27D 7/02; F27D 9/00; F27D 2007/023; F27D 2009/0005; F27D 2009/0075;

(Continued)

(56) References Cited

U.S. PATENT DOCUMENTS

| | | | | |
|---|---|---|---|---|
| 10,854,815 B2 * | 12/2020 | Han | ........................ | C23C 14/56 |
| 2011/0014397 A1 * | 1/2011 | Yang | ................. | H01J 37/32357 |
| | | | | 118/723 R |

(Continued)

FOREIGN PATENT DOCUMENTS

| | | |
|---|---|---|
| JP | 6757629 B2 | 9/2020 |
| KR | 1020020074243 A | 9/2002 |

(Continued)

OTHER PUBLICATIONS

Oregon_OSHA_indexed_memo_IM-94-12_1980.pdf (Year: 1980).*

*Primary Examiner* — Michael G Hoang
*Assistant Examiner* — Kurt J Wolford
(74) *Attorney, Agent, or Firm* — CANTOR COLBURN LLP

(57) ABSTRACT

A heat treatment device includes a chamber accommodating a work substrate including a first organic layer, a heater part which is disposed in the chamber and heats the work substrate, an air supply part including a first nozzle which supplies an external air to the chamber, a second nozzle which is disposed in the first nozzle and supplies a process gas to the chamber, and a cover part provided through which an opening overlapping the second nozzle is defined and which is disposed at an end of the first nozzle, which is adjacent to an outlet of the first nozzle, and an air exhaust part exhausting particles in the chamber to an outside of the chamber.

17 Claims, 11 Drawing Sheets

(51) Int. Cl.

| | | |
|---|---|---|
| *B05B 1/30* | (2006.01) | |
| *B05B 1/32* | (2006.01) | |
| *F27B 5/16* | (2006.01) | |
| *F27D 9/00* | (2006.01) | |
| *H10K 71/00* | (2023.01) | |
| *H10K 71/10* | (2023.01) | |
| *H10K 71/40* | (2023.01) | |
| *H10P 72/00* | (2026.01) | |

(52) U.S. Cl.
CPC .............. *H10K 71/10* (2023.02); *H10K 71/40* (2023.02); *H10P 72/0434* (2026.01); *B05B 1/005* (2013.01); *B05B 1/3006* (2013.01); *B05B 1/323* (2013.01); *F27B 2005/162* (2013.01); *F27B 2005/164* (2013.01); *F27D 2007/023* (2013.01); *F27D 2009/0005* (2013.01); *F27D 2009/0075* (2013.01); *H10P 72/0432* (2026.01)

(58) Field of Classification Search
CPC ............................ F27B 5/16; F27B 2005/162; F27B 2005/164; H01L 21/67109; H10K 71/40; B05B 1/005; B05B 1/3006; B05B 1/323

See application file for complete search history.

(56) References Cited

U.S. PATENT DOCUMENTS

| | | | |
|---|---|---|---|
| 2021/0151333 A1* | 5/2021 | Lee ................... | H01L 21/67103 |
| 2022/0130651 A1* | 4/2022 | Amikura ........... | H01L 21/67248 |

FOREIGN PATENT DOCUMENTS

| | | |
|---|---|---|
| KR | 1020040087699 A | 10/2004 |
| KR | 100900623 B1 | 6/2009 |
| KR | 1020160011974 A | 2/2016 |
| KR | 101676640 B1 | 11/2016 |
| KR | 1020200013822 A | 2/2020 |
| KR | 102238028 B1 | 4/2021 |
| KR | 1020210128066 A | 10/2021 |

* cited by examiner

HEAT TREATMENT DEVICE AND METHOD OF MANUFACTURING DISPLAY PANEL USING THE SAME

This application claims priority to Korean Patent Application No. 10-2022-0056941, filed on May 10, 2022, and all the benefits accruing therefrom under 35 U.S.C. § 119, the content of which in its entirety is herein incorporated by reference.

BACKGROUND

1. Field

The disclosure relates to a heat treatment device and a method of manufacturing a display panel using the same. More particularly, the disclosure relates to a heat treatment device with improved process reliability and a method of manufacturing a display panel using the heat treatment device.

2. Description of the Related Art

A heat treatment process includes a process of heating a work substrate through a heat treatment device and a process of cooling the heated work substrate. During the cooling process, external air is supplied into a chamber. In a case where a foreign substance accumulates inside a nozzle through which the external air is supplied while heating the work substrate, the foreign substance is introduced into the chamber during the cooling process of the work substrate. Accordingly, a nozzle that prevents the foreign substance from being introduced into the chamber is desired to improve reliability of the heat treatment process.

In recent years, as a base substrate of a display device, a market demand for a plastic substrate having a flexible property is increasing instead of a glass substrate. A polyimide layer is applied to the plastic substrate, for example. The polyimide layer is formed through the heat treatment process including the process of heating the work substrate obtained by coating a carrier substrate with a polyimide precursor solution and the process of cooling the work substrate.

SUMMARY

The disclosure provides a heat treatment device that reduces a foreign substance introduced into a chamber during a heat treatment process to form a polyimide layer of a display device with reduced defects.

The disclosure provides a method of manufacturing a display panel using the heat treatment device.

An embodiment of the inventive concept provides a heat treatment device including a chamber accommodating a work substrate including a first organic layer, a heater part which is disposed in the chamber and heats the work substrate, an air supply part including a first nozzle which supplies an external air to the chamber, a second nozzle which is disposed in the first nozzle and supplies a process gas to the chamber, and a cover part through which an opening overlapping the second nozzle is defined and which is disposed at an end of the first nozzle, which is adjacent to an outlet of the first nozzle, and an air exhaust part exhausting particles in the chamber to an outside of the chamber.

In an embodiment, the second nozzle is spaced apart from the cover part at a predetermined distance in a direction in which the second nozzle extends in a cross-section.

In an embodiment, the second nozzle includes an outlet disposed in the opening and spaced apart from an inner side surface of the cover part, which defines the opening.

In an embodiment, the opening has a circular shape or a polygonal shape in a plan view.

In an embodiment, the cover part includes a first cover part defining the opening and a second cover part disposed in the opening and having a mesh shape in a plan view.

In an embodiment, the cover part extends from the end of the first nozzle to a direction inclined with respect to a direction in which the first nozzle extends, and the cover part has a diameter decreasing as a distance from the end of the first nozzle increases.

In an embodiment, the cover part includes a first sub-portion extending from the end of the first nozzle to a direction substantially perpendicular to a direction in which the first nozzle extends and covering a portion of the outlet of the first nozzle in a cross-section and a second sub-portion extending from the first sub-portion to a direction away from the outlet of the first nozzle.

In an embodiment, each of the first nozzle, the second nozzle, and the cover part is provided in plural, and the air supply part further includes a first connector connected to an inlet of each of first nozzles and a second connector connected to an inlet of each of the second nozzles and surrounding the first connector.

In an embodiment, the air supply part further includes a valve disposed at an end adjacent to an inlet of the first connector.

In an embodiment, the air supply part further includes a filter disposed at the inlet of the first connector.

In an embodiment, the chamber is provided with sidewall openings defined through a sidewall thereof, the first nozzles are respectively inserted into the sidewall openings, and each of the first connector and the second connector is disposed outside the chamber and is disposed adjacent to the sidewall through which the sidewall openings are defined.

In an embodiment, the process gas includes an inert gas.

In an embodiment, the cover part is coupled with the end of the first nozzle by a welding process.

In an embodiment, the heater part is operated in a first mode, the air supply part supplies the process gas to the chamber in the first mode, the heater part is not operated in a second mode, and the air supply part supplies the process gas and the external air to the chamber in the second mode.

In an embodiment, the work substrate further includes a carrier substrate disposed under the first organic layer, and the first organic layer is converted to a second organic layer after the first mode and the second mode are sequentially performed.

In an embodiment, the second organic layer includes polyimide.

In an embodiment, the air supply part further includes a nozzle supporter disposed in the first nozzle and fixing the second nozzle.

An embodiment of the inventive concept provides a method of manufacturing a display panel. The method includes providing a work substrate including a carrier substrate and a first organic layer formed on the carrier substrate and forming a second organic layer from the first organic layer using a heat treatment device including a chamber accommodating the work substrate, a heater part disposed in the chamber, an air exhaust part exhausting particles in the chamber to an outside of the chamber, and an air supply part including a first nozzle, a second nozzle disposed in the first nozzle to supply a process gas to the chamber, and a cover part disposed at an end of the first nozzle, which is adjacent to an outlet. The forming the second organic layer includes operating the heater part to heat the first organic layer and supplying an external air to the chamber via the first nozzle to cool the first organic layer.

In an embodiment, the method further includes forming a circuit element layer including a transistor and a capacitor on the second organic layer and forming a light-emitting element layer including a light-emitting element on the circuit element layer after the forming the second organic layer.

In an embodiment, the method further includes forming an inorganic layer on the second organic layer, forming a first additional organic layer on the inorganic layer, and forming a second additional organic layer from the first additional organic layer using the heat treatment device after the forming the second organic layer. The forming the second additional organic layer includes operating the heater part to heat the first additional organic layer and supplying the external air to the chamber via the first nozzle to cool the first additional organic layer.

According to the above, the heat treatment device prevents the particles formed in the chamber during the process of heating the work substrate from entering the air supply part. Thus, a foreign substance is prevented from being introduced into the chamber during the process of cooling the work substrate. Accordingly, reliability and uniformity of the heat treatment process with respect to the work substrate are improved.

According to the method of manufacturing the display panel, a base layer is formed using the heat treatment device with improved reliability and uniformity with respect to the heat treatment process. Thus, the base layer with reduced defects is provided, and a reliability of the display panel is improved.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION

Figure 1:
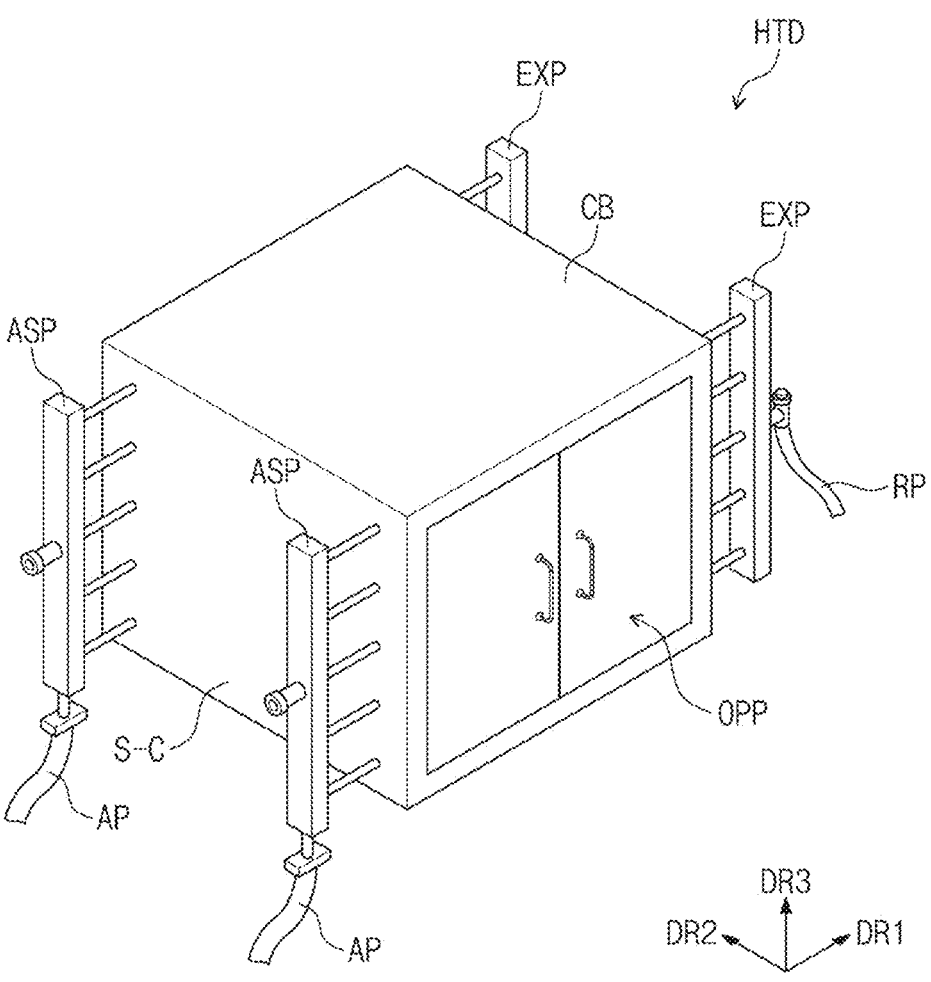
FIG. 1 is a perspective view of an embodiment of a heat treatment device according to the disclosure.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" or the like, may be used herein for ease of description to describe one element or feature's relationship to another elements or features as shown in the drawing figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to accompanying drawings.

Figure 2:
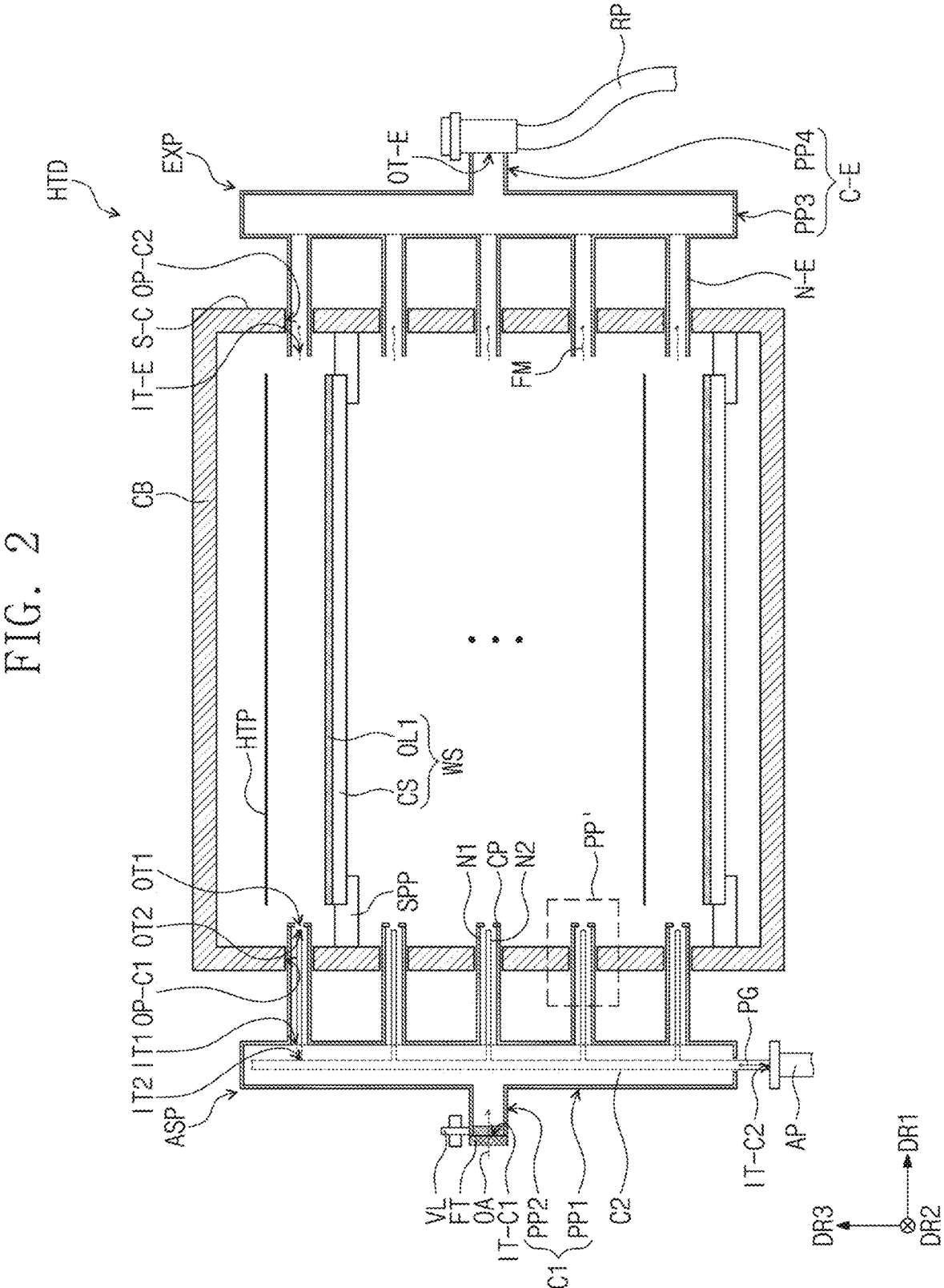
FIG. 2 is a cross-sectional view of an embodiment of a heat treatment device according to the disclosure.
Figure 3:
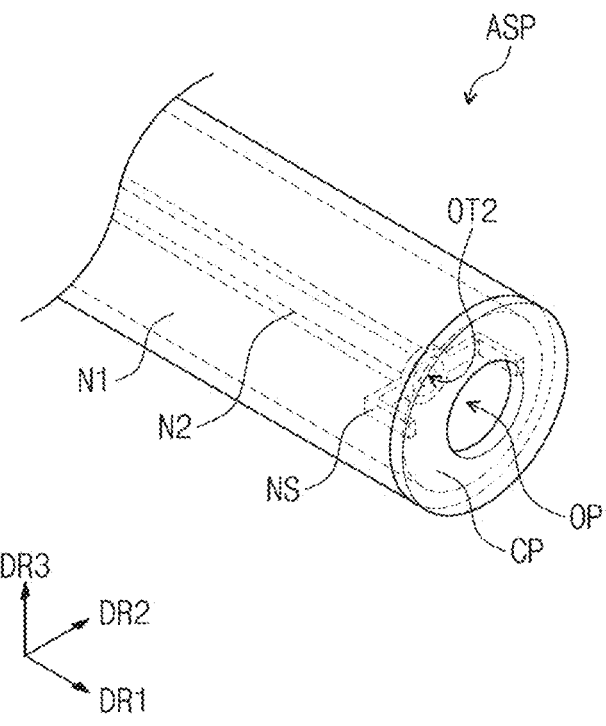
FIG. 3 is an enlarged perspective view of an embodiment of a portion of a heat treatment device according to the disclosure.

FIG. 1 is a perspective view of an embodiment of a heat treatment device HTD according to the disclosure. FIG. 2 is a cross-sectional view of an embodiment of the heat treatment device HTD according to the disclosure. FIG. 3 is an enlarged perspective view of an embodiment of a portion of the heat treatment device HTD according to the disclosure.

Referring to FIG. 1, the heat treatment device HTD may include a chamber CB, an air supply part ASP, an air exhaust part EXP, a gas supply part AP, and a transfer pipe RP.

The chamber CB may provide a predetermined space in which a work substrate WS (refer to FIG. 2) is loaded and a heat treatment process is performed on the work substrate WS (refer to FIG. 2). The chamber CB may include a bottom surface, a ceiling surface facing the bottom surface, and sidewalls S-C surrounding the bottom surface and the ceiling surface to define an inner space. The bottom surface of the chamber CB may be substantially parallel to a plane defined by a first direction DR1 and a second direction DR2. A normal line direction of the bottom surface of the chamber CB may be indicated by a third direction DR3.

An opening portion OPP may be defined through the chamber CB. The opening portion OPP may be closed while the work substrate WS is heat treated in the chamber CB and may be opened while the work substrate WS is loaded into the chamber CB from the outside of the chamber CB or the work substrate WS is unloaded from the chamber CB to the outside.

Accordingly, the opening portion OPP may provide a passage for the work substrate WS to be loaded into the chamber CB from the outside or vice versa. In an embodiment, the opening portion OPP may be defined through one of the sidewalls S-C of the chamber CB.

The air supply part ASP may be placed on the sidewalls S-C of the chamber CB. The air supply part ASP may supply a process gas PG (refer to FIG. 2) and an external air OA (refer to FIG. 2), which are described later, to the chamber CB. This will be described in detail later.

FIG. 1 shows the heat treatment device HTD to which two air supply parts ASP are applied as an illustrative embodiment. The two air supply parts ASP may be arranged substantially parallel to each other on one sidewall along the second direction DR2. However, the number and position of the air supply parts ASP should not be limited thereto or thereby.

The gas supply part AP may be connected to the air supply part ASP. The gas supply part AP may supply the process gas PG (refer to FIG. 2) to the air supply part ASP. The process gas PG (refer to FIG. 2) may be supplied to the air supply part ASP via the gas supply part AP and may be supplied to the chamber CB via the air supply part ASP.

The air exhaust part EXP may be placed on one sidewall of the sidewalls S-C of the chamber CB. The air exhaust part EXP may provide a work material FM (refer to FIG. 2) in the chamber CB to the outside of the chamber CB.

In the disclosure, the work material may include smoke including particles in a solid or liquid state provided inside the chamber CB during the heat treatment process of the work substrate WS (refer to FIG. 2). The work material FM (refer to FIG. 2) may be diffused inside the chamber CB during the heat treatment process and may contaminate the inside of the chamber CB. Accordingly, the work material FM (refer to FIG. 2) may cause a deterioration in reliability and uniformity of the heat treatment process.

In the illustrated embodiment, the air exhaust part EXP may exhaust the work material FM (refer to FIG. 2) in the chamber CB to the outside of the chamber CB to prevent the inside of the chamber CB from being contaminated.

In an embodiment, the air exhaust part EXP may be disposed on a sidewall different from the sidewall on which the air supply part ASP is placed in the chamber CB. In an embodiment, the air exhaust part EXP may be placed to face the air supply part ASP in the first direction DR1. However, the disclosure should not be limited thereto or thereby, and the air exhaust part EXP and the air supply part ASP may be placed on the same sidewall of the chamber CB to be substantially parallel to each other.

FIG. 1 shows the heat treatment device HTD employing two air exhaust parts EXP as an illustrative embodiment. The two air exhaust parts EXP may be placed substantially parallel to each other on one sidewall along the second direction DR2. However, the number and position of the air exhaust parts EXP should not be limited thereto or thereby.

The transfer pipe RP may be connected to the air exhaust part EXP. The transfer pipe RP may supply the work material FM (refer to FIG. 2) exhausted from the chamber CB via the air exhaust part EXP to a work material processing device (not shown). The work material processing device may collect the work material FM (refer to FIG. 2) and may process the work material FM (refer to FIG. 2), so that the work material FM (refer to FIG. 2) may not damage a human body or may not pollute an environment.

Referring to FIGS. 2 and 3, the heat treatment device HTD may include the chamber CB, a support part SPP, a heater part HTP, the air supply part ASP, the gas supply part AP, the air exhaust part EXP, and the transfer pipe RP.

The chamber CB may accommodate the work substrate WS. The work substrate WS may include a carrier substrate CS and a first organic layer OL1.

The carrier substrate CS may be used as a support substrate in the heat treatment process of the first organic layer OL1. The carrier substrate CS may be a glass substrate. The carrier substrate CS may be used as the support substrate in a process of forming some parts of the display device after the heat treatment process. The carrier substrate CS may be removed after the heat treatment process.

The first organic layer OL1 may be disposed on the carrier substrate CS. The first organic layer OL1 may be the subject of the heat treatment process. The first organic layer OL1 may include a first organic material. The first organic material may be formed as a second organic material through the heat treatment process using the heat treatment device, and the first organic layer OL1 may be converted to a second organic layer OL2 (refer to FIG. 8C). That is, the first organic material may be a precursor of the second organic material.

In an embodiment, the first organic material may include a polyimide precursor, e.g., poly(amic) acid ("PAA"). The second organic material may include polyimide ("PI"). The first organic material may be converted into the second organic material through a degradation/condensation reaction (imidization). Through this, the second organic layer OL2 (refer to FIG. 8C) may be provided as a polyimide substrate in the form of a film through the heat treatment device. The second organic layer OL2 (refer to FIG. 8C) may be used as a base layer BL (refer to FIG. 8E) of a display panel DP (refer to FIG. 8E). This will be described in detail later.

Figure 8A:
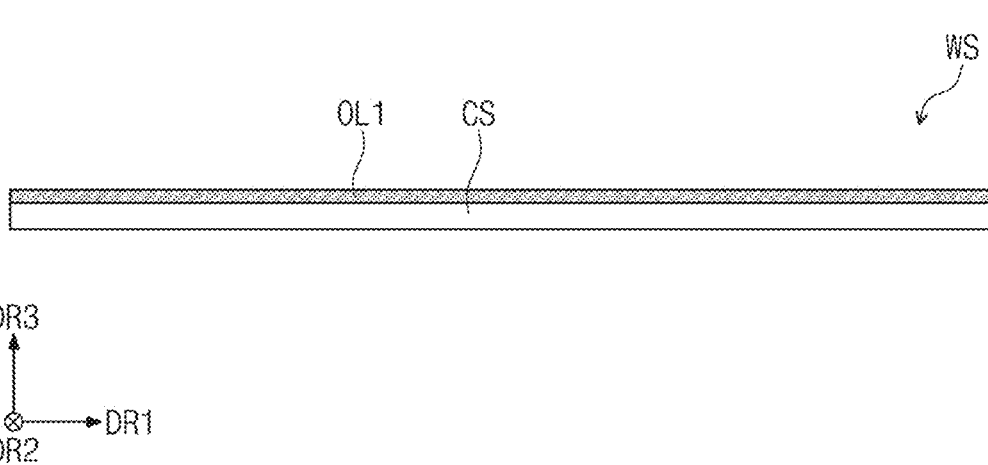
FIGS. 8A to 8E are views of an embodiment of a method of manufacturing a display panel according to the disclosure.
Figure 8B:
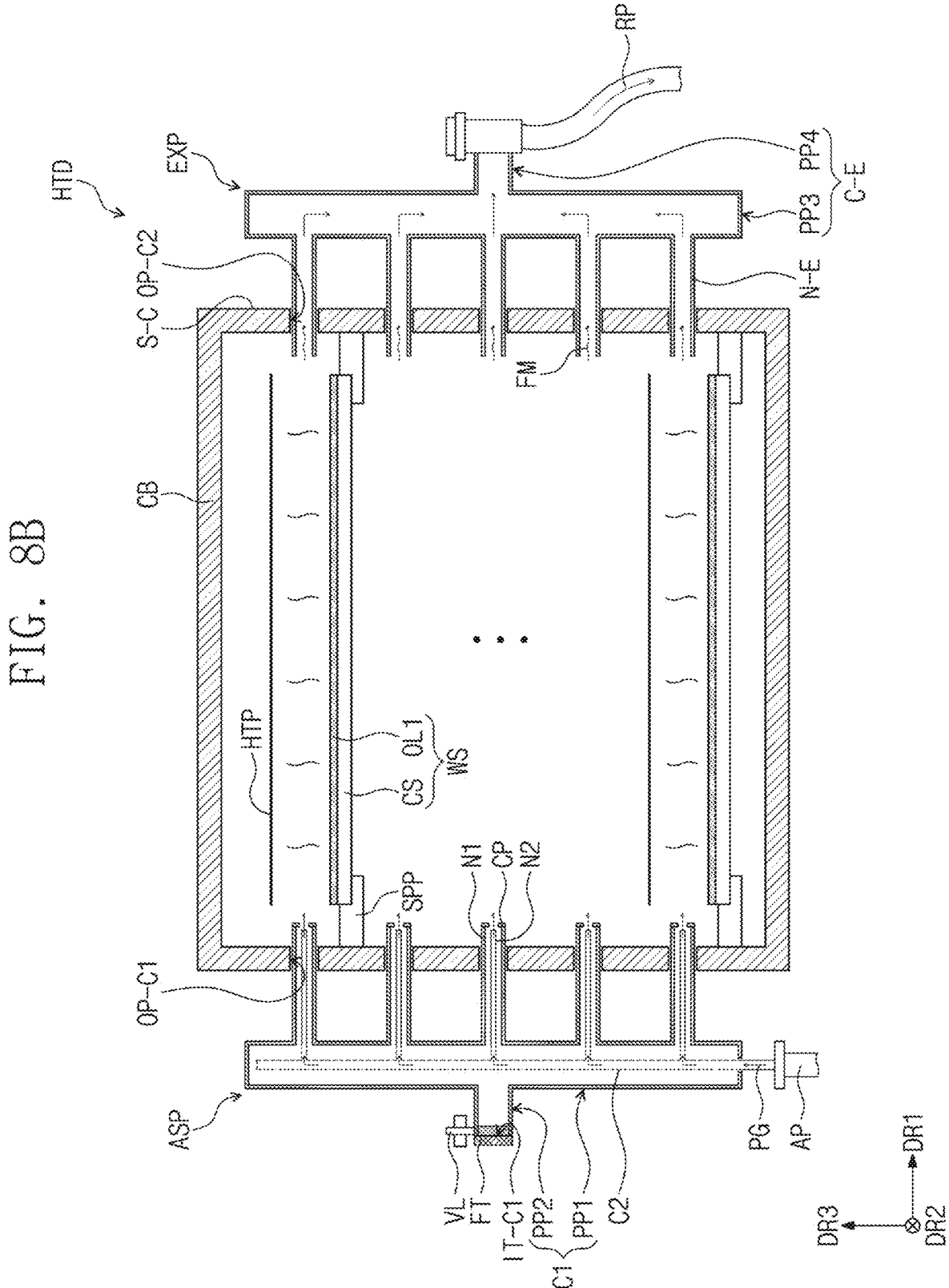
Figure 8C:
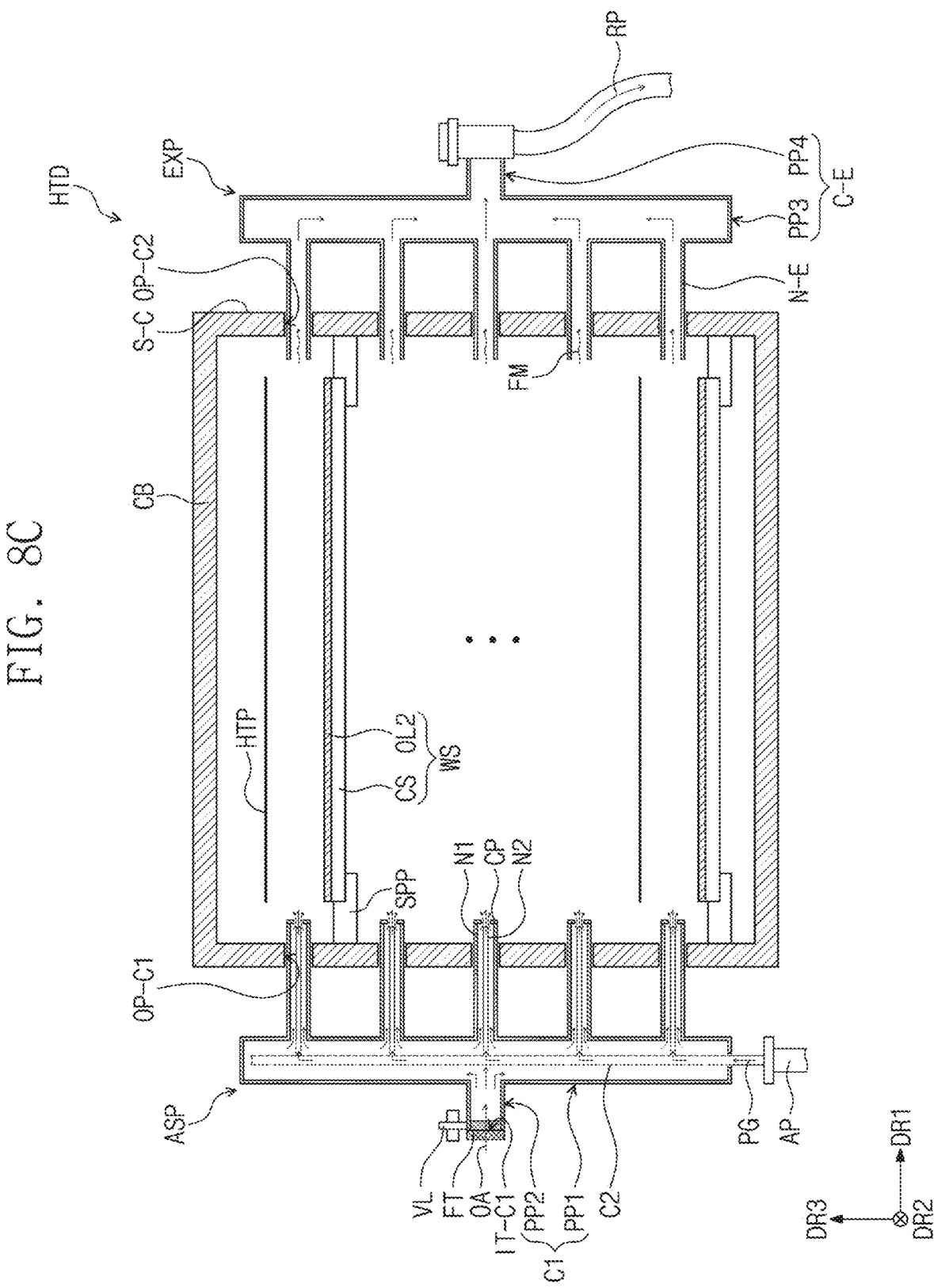

In the disclosure, the process of heat-treating the work substrate WS using the heat treatment device HTD may include heating the work substrate WS (refer to FIG. 8B) and cooling the work substrate WS (refer to FIG. 8C).

In the disclosure, during the heating of the work substrate WS, the heat treatment device HTD operates in a first mode, and during the cooling of the work substrate WS, the heat treatment device HTD operates in a second mode.

In an embodiment, the chamber CB may accommodate multiple work substrates WS. The work substrates WS may be arranged spaced apart from each other along the third direction DR3 in the chamber CB.

Sidewall openings OP-C1 and OP-C2 may be defined through the sidewalls S-C of the chamber CB. The sidewall openings OP-C1 and OP-C2 may include first sidewall openings OP-C1 and second sidewall openings OP-C2.

The first sidewall openings OP-C1 may provide a passage through which the process gas PG and the external air OA are introduced into the chamber CB. The second sidewall openings OP-C2 may provide a passage through which the work material FM inside the chamber CB is exhausted to the outside of the chamber CB.

In an embodiment, the first and second sidewall openings OP-C1 and OP-C2 may be defined through the sidewalls S-C in which the opening portion OPP (refer to FIG. 1) is not defined among the sidewalls S-C of the chamber CB. The first sidewall openings OP-C1 and the second sidewall openings OP-C2 may be respectively defined through the sidewalls S-C facing each other, however, the disclosure should not be limited thereto or thereby. In an embodiment, the first sidewall openings OP-C1 and the second sidewall openings OP-C2 may be defined through one sidewall among the sidewalls S-C or may be respectively defined through sidewalls adjacent to each other among the sidewalls S-C.

The support part SPP may be placed on the sidewalls S-C of the chamber CB and may support the work substrate WS. However, the shape, position, and number of the support parts SPP should not be particularly limited as long as the support part SPP may support the work substrate WS.

The heater part HTP may be disposed in the chamber CB and may heat the work substrate WS. The heater part HTP may operate in the first mode and may stop its operation in the second mode.

In an embodiment, the heater part HTP may be provided in plural, and each of the heater parts HTP may face a corresponding work substrate among the work substrates WS. However, the position and the number of the heater parts HTP should not be particularly limited as long as the heater part HTP may heat the work substrate WS.

The air supply part ASP may be placed on the sidewall through which the first sidewall openings OP-C1 are defined among the sidewalls S-C of the chamber CB. The air supply part ASP may include first nozzles N1, cover parts CP, a first connector C1, a valve VL, a filter FT, second nozzles N2, a nozzle supporter NS, and a second connector C2. FIG. 3 shows one first nozzle N1, one second nozzle N2, and one cover part CP among components of the air supply part ASP.

Each of the first nozzles N1 may be provided in the form of a hollow tube. In an embodiment, each of the first nozzles N1 may be a metal pipe.

Each of the first nozzles N1 may extend in the first direction DR1. The first nozzles N1 may be arranged spaced apart from each other in the third direction DR3.

Each of the first nozzles N1 may be inserted into a corresponding first sidewall opening OP-C1. A portion of each of the first nozzles N1 may be inserted into the first sidewall opening OP-C1 and may protrude from an inner sidewall of the chamber CB, however, the disclosure should not be limited thereto or thereby. An outlet OT1 of each of the first nozzles N1 may be disposed inside the corresponding first sidewall opening OP-C1.

Each of the cover parts CP may be disposed at one end of a corresponding first nozzle N1, which is adjacent to the outlet OT1. The cover parts CP may be disposed in the chamber CB, however, the disclosure should not be limited thereto or thereby. The cover parts CP may be disposed in a corresponding first sidewall opening OP-C1.

Each of the cover parts CP may cover one end of the corresponding first nozzle N1. Each of the cover parts CP may be provided as a metal plate. In the illustrated embodiment, each of the cover parts CP may cover a portion of the outlet OT1 of the corresponding first nozzle N1. Each of the cover parts CP may include a plane defined by the second and third directions DR2 and DR3. That is, each of the cover parts CP may extend in a direction substantially perpendicular to a direction in which the corresponding first nozzle N1 extends. The cover parts CP and the first nozzles N1 may include the same metal material. Each of the cover parts CP may be attached to the one end of the first nozzle N1 through a welding process. The welding process may be an argon welding process.

Each of the cover parts CP may be provided with an opening OP defined therethrough along a thickness direction of the cover parts CP. The opening OP may be defined through a center of each of the cover parts CP. Each of the cover parts CP may be attached to the one end of the corresponding first nozzle N1 such that the outlet OT1 of the corresponding first nozzle N1 may overlap the opening OP in the first direction DR1. Each of the cover parts CP may provide a passage for the process gas PG and the external air OA to be discharged from the air supply part ASP.

In an embodiment, the opening OP may have a circular shape when viewed in the first direction DR1. However, the disclosure should not be limited thereto or thereby, and various shapes of the opening OP will be described later.

The first connector C1 may include a first portion PP1 and a second portion PP2.

The first portion PP1 may be connected to an inlet IT1 of each of the first nozzles N1. The first portion PP1 may extend in the third direction DR3 along the other end of each of the first nozzles N1, which is adjacent to the inlet IT1. Accordingly, an inner space of the first portion PP1 may be connected to an inner space of the first nozzles N1.

The second portion PP2 may protrude from the first portion PP1 to a direction opposite to the first direction DR1. One end of the second portion PP2 spaced apart from the first portion PP1 may provide an inlet IT-C1 of the first connector C1.

According to the disclosure, the first nozzles N1 and the first connector C1 may supply the external air OA to the inside of the chamber CB from the outside of the chamber CB. The external air OA may flow into the inlet IT-C1 of the first connector C1 and may be dispersed in the first connector C1. The external air OA dispersed in the first connector C1 may flow into the inlet IT1 of each of the first nozzles N1, may be exhausted through the outlet OT1 of each of the first nozzles N1, and may be supplied into the chamber CB.

In the disclosure, the first nozzles N1 and the first connector C1 may supply the external air OA into the chamber CB only in the second mode. That is, the external air OA may be supplied into the chamber CB only in the cooling of the work substrate WS of the heat treatment process. Due to the external air OA, a temperature in the chamber CB may be lowered, and the work substrate WS heated in the first mode may be cooled.

The filter FT may be disposed at the inlet IT-C1 of the first connector C1. The filter FT may filter a foreign substance in the external air OA. The filter FT may allow only gases whose particle size is below a predetermined level among external air OA to pass through and to flow into the first connector C1. In an embodiment, the filter FT may filter out particles having a size greater than about 0.6 micrometers.

The valve VL may be disposed at one end of the first connector C1, which is adjacent to the inlet IT-C1. The valve VL may control the flow of the external air OA into the first connector C1. The valve VL may block the inlet IT-C1 of the first connector C1 in the first mode and thus may shield an inner space of the first connector C1 from the air outside of the chamber CB. On the contrary, the valve VL may open the inlet IT-C1 of the first connector C1 in the second mode and thus may allow the external air OA to flow into the chamber CB.

Each of the second nozzles N2 may be disposed in a corresponding first nozzle among the first nozzles N1. Each of the second nozzles N2 may be provided in the form of a hollow tube. In an embodiment, each of the second nozzles N2 may be a metal pipe.

Each of the second nozzles N2 may extend in the first direction DR1. The second nozzles N2 may be arranged spaced apart from each other in the third direction DR3.

One end of each of the second nozzles N2, which is adjacent to an outlet OT2, may be disposed in the first sidewall opening OP-C1, however, the disclosure should not be limited thereto or thereby. In an embodiment, the one end of each of the second nozzles N2 may be disposed in the chamber CB after passing through the first sidewall opening OP-C1 or may be spaced apart from the first sidewall opening OP-C1 in the direction opposite to the first direction DR1 to be disposed outside the chamber CB.

As shown in FIG. 3, the nozzle supporter NS may be disposed in the first nozzle N1. The nozzle supporter NS may extend from an inner wall of the first nozzle N1 to an outer wall of the second nozzle N2. The nozzle supporter NS may surround the outer wall of the second nozzle N2. The nozzle supporter NS may be fixed to the inner wall of the first nozzle N1 and may support the second nozzle N2.

The nozzle supporter NS may be aligned with the one end of the second nozzle N2, however, it should not be limited thereto or thereby. The position and the number of the nozzle supporters NS should not be particularly limited as long as the nozzle supporter NS may fix the second nozzle N2.

The second connector C2 may be disposed in the first connector C1. The second connector C2 may be connected to an inlet IT2 of each of the second nozzles N2. The second connector C2 may extend in the third direction DR3 along the other end of the second nozzles N2, which is adjacent to the inlet IT2. Accordingly, an inner space of the second connector C2 may be connected to an inner space of the second nozzles N2.

One end of the second connector C2, which is adjacent to an inlet IT-C2, may be connected to the gas supply part AP. The gas supply part AP may supply the process gas PG to the second connector C2.

In the illustrated embodiment, the second connector C2 and the second nozzles N2 may supply the process gas PG flowing therein via the gas supply part AP to the inside of the chamber CB from the outside of the chamber CB. The process gas PG may flow into the inlet IT-C2 of the second connector C2 and may be dispersed in the second connector C2. In addition, the process gas PG may flow into the inlet IT2 of each of the second nozzles N2, may be exhausted via the outlet OT2 of each of the second nozzles N2, and may be supplied to the chamber CB.

In the disclosure, the second connector C2 and the second nozzles N2 may supply the process gas PG to the chamber CB both in the first mode and the second mode. The process gas PG may be an inert gas. In an embodiment, the process gas PG may be a nitrogen gas (N2). The process gas PG may maintain the chamber CB in a positive pressure state. Accordingly, the work material FM generated during the heat treatment process may be smoothly exhausted to the outside of the chamber CB.

The air exhaust part EXP may be placed on the sidewall through which the second sidewall openings OP-C2 are defined among the sidewalls S-C of the chamber CB. The air exhaust part EXP may include exhaust nozzles N-E and an exhaust connector C-E.

Each of the exhaust nozzles N-E may extend in the first direction DR1. The exhaust nozzles N-E may be arranged spaced apart from each other in the third direction DR3. Each of the exhaust nozzles N-E may be inserted into a corresponding second sidewall opening among the second sidewall openings OP-C2. A portion of each of the exhaust nozzles N-E may protrude from the sidewall of the chamber CB after passing through the corresponding second sidewall opening OP-C2, however, the disclosure should not be limited thereto or thereby. In an embodiment, an inlet IT-E of each of the exhaust nozzles N-E may be disposed in the corresponding second sidewall opening OP-C2.

The exhaust connector C-E may include a third portion PP3 and a fourth portion PP4.

The third portion PP3 may extend in the third direction DR3 along the other end of each of the exhaust nozzles N-E, which is adjacent to an outlet of the exhaust nozzles N-E. The third portion PP3 may be connected to the other ends of the exhaust nozzles N-E. Accordingly, an inner space of the third portion PP3 may be connected to an inner space of the exhaust nozzles N-E.

The fourth portion PP4 may protrude from the third portion PP3 to the first direction DR1. One end of the fourth portion PP4 spaced apart from the third portion PP3 may provide an outlet OT-E of the exhaust connector C-E. The one end of the fourth portion PP4 may be connected to the transfer pipe RP.

In the illustrated embodiment, the exhaust nozzles N-E and the exhaust connector C-E may transfer the work material FM in the chamber CB to the outside of the chamber CB. The work material FM in the chamber CB may flow into the inlet IT-E of each of the exhaust nozzles N-E, may be exhausted via the outlet OT-E of the exhaust connector C-E, and may be exhausted to the outside of the chamber CB.

Figure 4A:
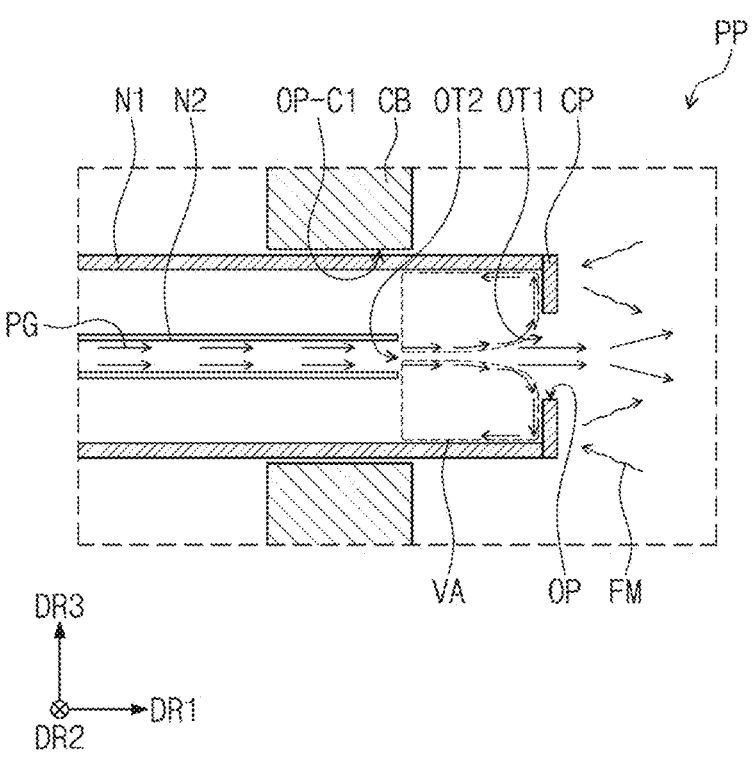
FIGS. 4A and 4B are cross-sectional views of an embodiment of an area PP' of FIG. 2 according to the disclosure.
Figure 4B:
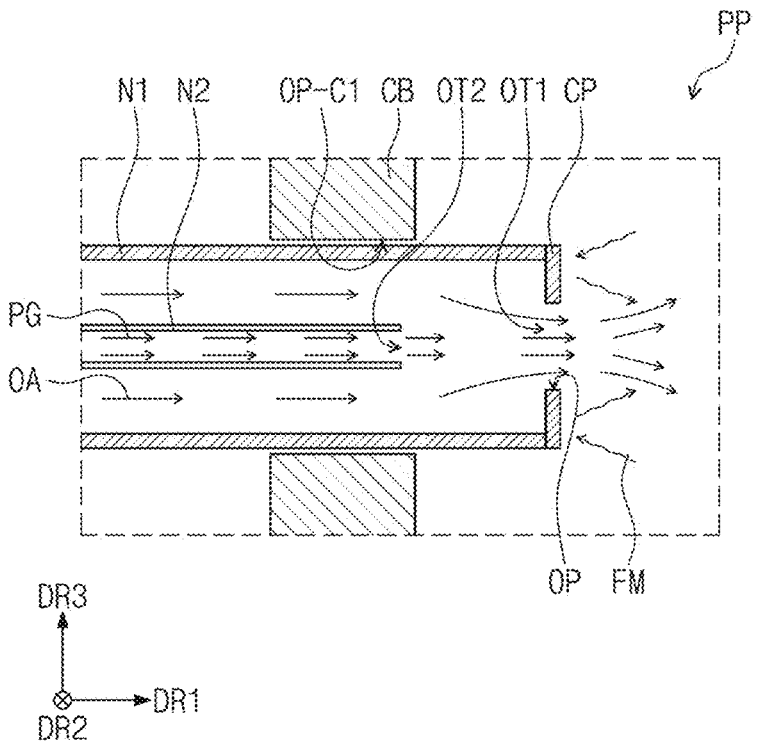

FIGS. 4A and 4B are cross-sectional views of an area PP' of FIG. 2 according to the disclosure. FIGS. 4A and 4B show one first nozzle N1, one second nozzle N2, and one cover part CP among components of the air supply part ASP. FIG. 4A is a cross-sectional view of the heat treatment device HTD (refer to FIG. 2) operated in the first mode, and FIG. 4B is a cross-sectional view of the heat treatment device HTD (refer to FIG. 2) operated in the second mode.

In the illustrated embodiment, the one end of the second nozzle N2 may be spaced apart from the cover part CP in the extension direction of the second nozzle N2, i.e., the first direction DR1, at a predetermined distance. That is, the one end of the first nozzle N1 may protrude in the first direction DR1 further than the one end of the second nozzle N2.

As shown in FIG. 4A, only the process gas PG may be exhausted through the outlet OT2 of the second nozzle N2 in the first mode.

Different from the illustrated embodiment, in a case where the cover part CP is not disposed at the one end of the first nozzle N1 and the one end of the first nozzle N1 and the one end of the second nozzle N2 are aligned with each other in the third direction DR3, an airflow in the first direction DR1 may not occur in a space defined between the inner wall of the first nozzle N1 and the outer wall of the second nozzle N2. Accordingly, the work material FM in the chamber CB may flow in between the one end of the first nozzle N1 and the one end of the second nozzle N2. The work material FM may be dispersed in the first nozzle N1 and may be adhered to the inner wall of the first nozzle N1 and the outer wall of the second nozzle N2, and as a result, the foreign substance may be formed in the first nozzle N1.

On the contrary, in the illustrated embodiment, as the cover part CP disposed at the one end of the first nozzle N1 covers a portion of the outlet OT1 of the first nozzle N1, the space through which the work material flows into the first nozzle N1 may be physically blocked. Accordingly, the work material FM may be prevented from entering the first nozzle N1.

In addition, in the illustrated embodiment, as the one end of the second nozzle N2 is spaced apart from the opening OP in the first direction DR1 and the portion of the outlet OT1 of the first nozzle N1 is covered by the cover part CP, the process gas PG exhausted via the outlet OT2 of the second nozzle N2 may flow in the third direction DR3 and the direction opposite to the third direction DR3 along the cover part CP in the vicinity of the outlet OT1 of the first nozzle N1. That is, as the process gas PG flows in a direction substantially perpendicular to the penetration direction of the opening OP defined through the cover part CP in the vicinity of the opening OP of the cover part CP, the work material FM in the chamber CB may be prevented from passing through the opening OP and entering the first nozzle N1.

In addition, the process gas PG may flow along the inner wall of the first nozzle N1, and thus, a vortex may be formed in a space (hereinafter, also referred to as a gap space) between the outlet OT2 of the second nozzle N2 and the outlet OT1 of the first nozzle N1. In FIG. 4A, a vortex area VA in which the vortex of the process gas PG is formed in the first nozzle N1 is indicated by a dotted line. As a pressure in the gap space increases, the work material FM in the chamber CB may be prevented from entering the first nozzle N1.

Accordingly, the foreign substance may be prevented from being formed in the first nozzle N1.

As shown in FIG. 4B, during the second mode, the process gas PG may be exhausted through the outlet OT2 of the second nozzle N2 while the external air OA is exhausted through the outlet OT1 of the first nozzle N1.

In this case, when the cover part CP is not disposed at the one end of the first nozzle N1 and the one end of the first nozzle N1 and the one end of the second nozzle N2 are aligned with each other in the third direction DR3, the foreign substance is formed in the first nozzle N1 during the first mode, and the foreign substance is exhausted together with the external air OA and is supplied to the chamber CB during the second mode. Accordingly, the foreign substance is blown into the chamber CB during the heat treatment process, and as a result, the work substrate WS (refer to FIG. 2) is formed with defects.

However, in the illustrated embodiment, the foreign substance may not be formed in the first nozzle N1 during the first mode, and thus, the foreign substance may not be supplied to the chamber CB while the external air OA is supplied during the second mode. Accordingly, the reliability and uniformity of the heat treatment process may be improved by the heat treatment device HTD (refer to FIG. 1).

Figure 5A:
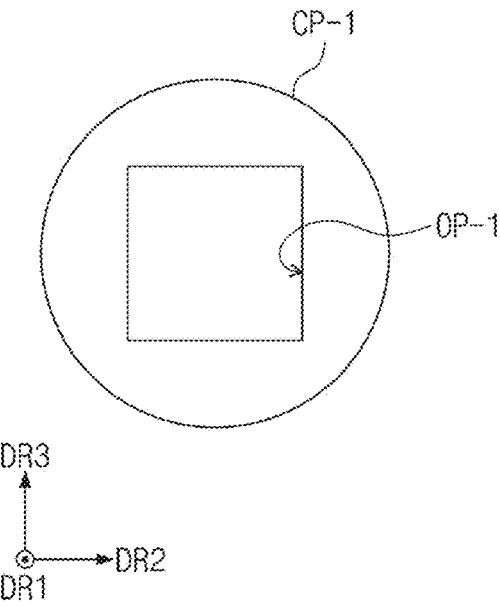
FIGS. 5A and 5B are cross-sectional views of an embodiment of a portion of a heat treatment device in embodiments of the disclosure.
Figure 5B:
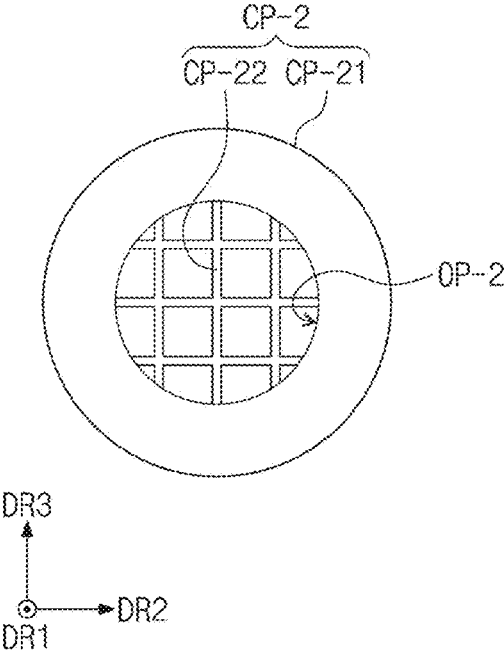

FIGS. 5A and 5B are plan views of a portion of a heat treatment device in embodiments of the disclosure. FIGS. 5A and 5B are plan views of cover parts CP-1 and CP-2 when viewed in the penetration direction of openings OP-1 and OP-2, that is, the first direction DR1.

Referring to FIG. 5A, the opening OP-1 of the cover part CP-1 may have a quadrangular shape in a plan view (Hereinafter, "in a plan view" means "in a plane viewed from the first direction DR1"), however, it should not be limited thereto or thereby. In an embodiment, the opening OP-1 may have a polygonal shape rather than the quadrangular shape. The shape of the opening OP-1 may be changed to suit a shape of each of the first nozzle N1 (refer to FIG. 4A) and the second nozzle N2 (refer to FIG. 4A) or a condition of the air supply part ASP.

In an embodiment, the one end of the first nozzle N1 (refer to FIG. 4A) may have a polygonal shape rather than a circular shape when viewed in a direction in which the first nozzle N1 (refer to FIG. 4A) extends. In this case, the cover part CP-1 and the opening OP-1 of the cover part CP-1 may have a polygonal shape corresponding to the shape of the one end of the first nozzle N1 (refer to FIG. 4A).

Referring to FIG. 5B, the cover part CP-2 may include a first cover part CP-21 and a second cover part CP-22.

The first cover part CP-21 may correspond to an outer portion of the cover part CP-2, and the opening OP-2 may be defined through the first cover part CP-21.

The second cover part CP-22 may correspond to an inner portion of the cover part CP-2 and may be disposed in the opening OP-2. The second cover part CP-22 may include surfaces extending in directions crossing each other in a plan view. In an embodiment, the second cover part CP-22 may have a mesh shape in the plan view.

The second cover part CP-22 may divide a passage through which gases inside the first nozzle N1 (refer to FIG. 4A) are exhausted into a plurality of areas. Accordingly, the area of the passage through which the particulate work material FM (refer to FIG. 4A) flows may also be reduced. Therefore, the work material FM (refer to FIG. 4A) in the chamber CB (refer to FIG. 1) may be effectively prevented from entering the first nozzle N1 (refer to FIG. 4A).

Figure 6A:
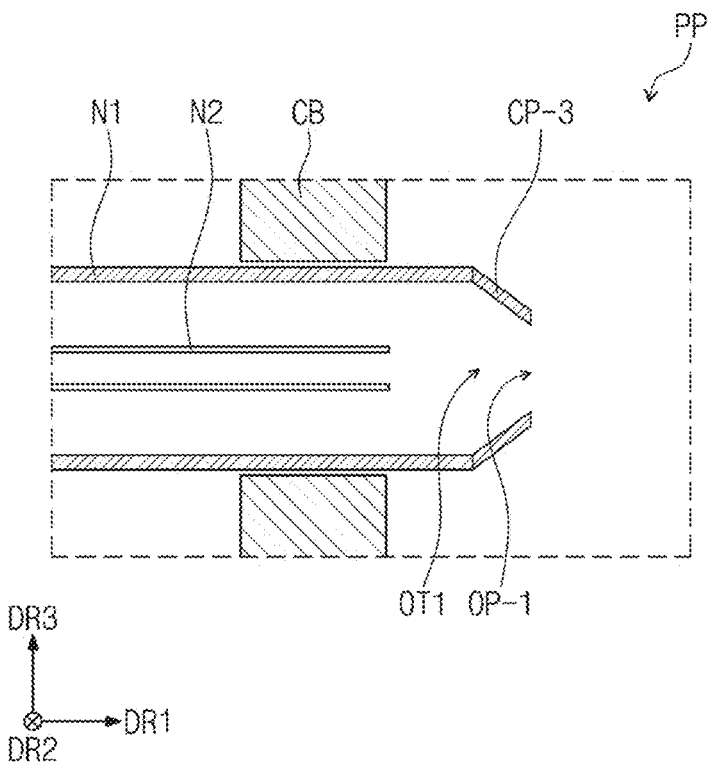
FIGS. 6A and 6B are cross-sectional views of an embodiment of an area PP' of FIG. 2 in embodiments of the disclosure.
Figure 6B:
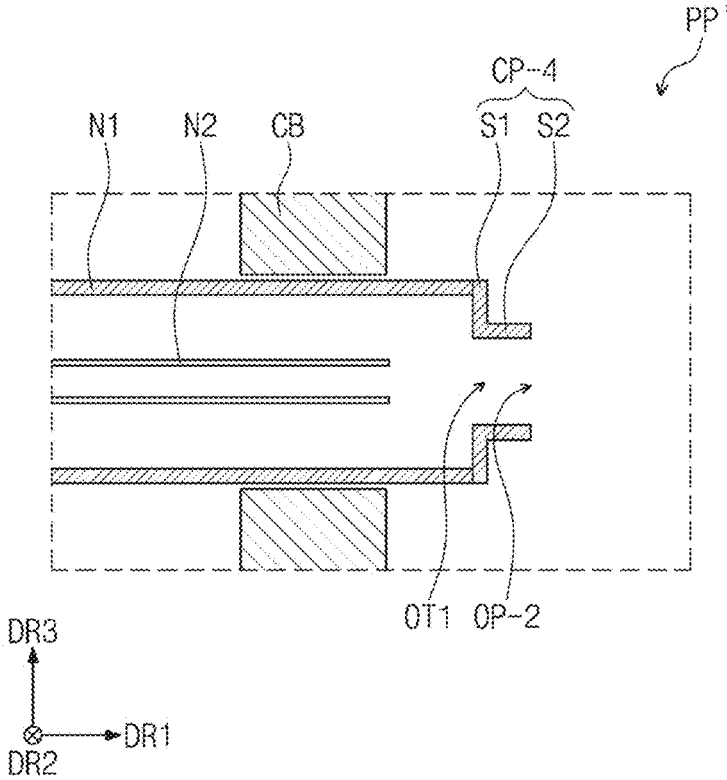

FIGS. 6A and 6B are cross-sectional views of an area PP' of FIG. 2 in embodiments of the disclosure. FIGS. 6A and 6B are cross-sectional views when viewed in the extension direction of first and second nozzles N1 and N2, that is, the second direction DR2.

Referring to FIG. 6A, a cover part CP-3 may be disposed at one end of a corresponding first nozzle N1, which is adjacent to an outlet OT1.

One end of the cover part CP-3 may contact the one end of the first nozzle N1. The cover part CP-3 may extend from the one end of the first nozzle N1 to a direction inclined toward an inner side of the first nozzle N1 with respect to a direction in which the first nozzle N1 extends.

In the illustrated embodiment, a diameter of the other end of the cover part CP-3 may be smaller than a diameter of the one end of the cover part CP-3. The diameter of the cover part CP-3 may decrease as a distance from the one end of the first nozzle N1 increases. The other end of the cover part CP-3 may define an opening OP-1 of the cover part CP-3.

Referring to FIG. 6B, a cover part CP-4 may be disposed at one end of a corresponding first nozzle N1, which is adjacent to an outlet OT1. The cover part CP-4 may include a first sub-portion S1 and a second sub-portion S2.

The first sub-portion S1 may be adjacent to the outlet OT1 of the first nozzle N1. In a cross-section, the first sub-portion S1 may extend from the one end of the first nozzle N1 to a direction toward an inner side of the first nozzle N1 and substantially perpendicular to a direction in which the first nozzle N1 extends. The first sub-portion S1 may cover a portion of the outlet OT1 of the first nozzle N1.

The second sub-portion S2 may extend from an end of the first sub-portion S1, which is spaced apart from the first nozzle N1, to the first direction DR1 away from the outlet OT1 of the first nozzle N1. The second sub-portion S2 may extend in the same direction as the extension direction of the first nozzle N1. The second sub-portion S2 may be substantially perpendicular to the first sub-portion S1.

A diameter at one end of the second sub-portion S2, which is adjacent to the first sub-portion S1, may be the same as a diameter at the other end of the second sub-portion S2, which is opposite to the one end of the second sub-portion S2 in the first direction DR1. The diameter of the second sub-portion S2 may be constant from the one end to the other end of the second sub-portion S2. The other end of the second sub-portion S2 may define an opening OP-2 of the cover part CP-4.

A boundary between the first sub-portion S1 and the second sub-portion S2 may have a step difference therebetween. FIG. 6B shows a structure in which one step-difference portion is formed in the cover part CP-4 as an illustrative embodiment, however, the disclosure should not be limited thereto or thereby. In an embodiment, the step-difference portion may be provided in plural in the cover part CP-4 to form three or more sub-portions, and a passage defined by the cover part CP-4 may be narrowed as a distance from the second nozzle N2 increases.

Figure 7:
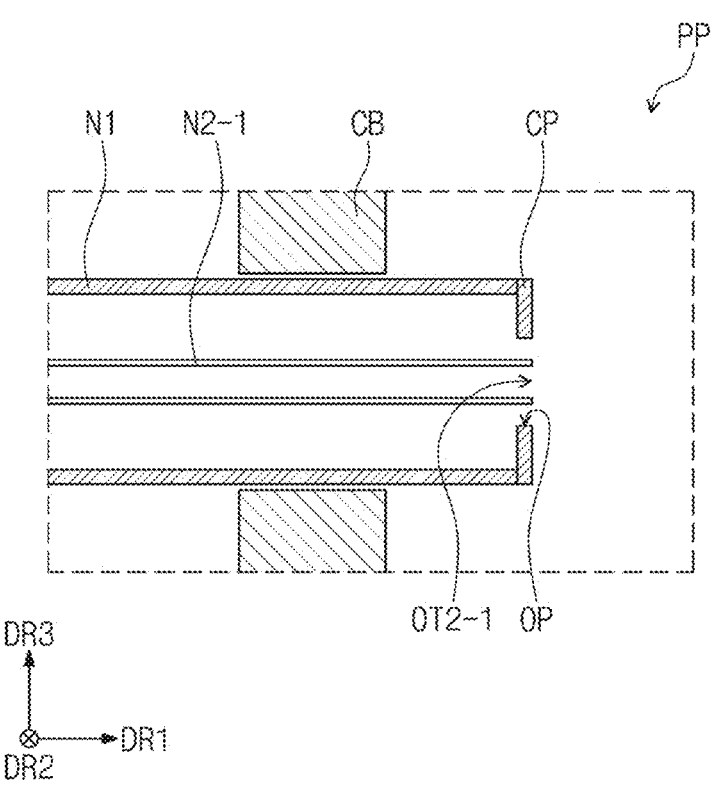
FIG. 7 is a cross-sectional view of an embodiment of an area PP' of FIG. 2 according to the disclosure.

FIG. 7 is a cross-sectional view of an embodiment of an area PP' of FIG. 2 according to the disclosure. FIG. 7 is a cross-sectional view of a first nozzle N1 and a second nozzle N2-1 when viewed in a direction in which the first nozzle N1 and the second nozzle N2-1 extend.

Referring to FIG. 7, an outlet OT2-1 of the second nozzle N2-1 may be disposed in an opening OP of a cover part CP. The second nozzle N2-1 may be spaced apart from an inner sidewall of the cover part CP, which defines the opening OP.

Even though one end of the second nozzle N2-1 is disposed in the opening OP, an amount of the work material FM entering the first nozzle N1 in the first mode may be reduced by the cover part CP covering a portion of an outlet OT1 (refer to FIG. 4A) of the first nozzle N1.

FIGS. 8A to 8E are cross-sectional views of an embodiment of a method of manufacturing a display panel according to the disclosure.

The manufacturing method of the display panel may include providing the work substrate including the carrier substrate and the first organic layer formed on the carrier substrate and forming the second organic layer from the first organic layer using the heat treatment device including the chamber accommodating the work substrate, the heater part disposed in the chamber, the air exhaust part exhausting the particles in the chamber to the outside of the chamber, and the air supply part including the first nozzle, the second nozzle disposed in the first nozzle to supply the process gas into the chamber, and the cover part disposed at the one end of the first nozzle, which is adjacent to the outlet. The forming of the second organic layer may include operating the heater part to heat the first organic layer and supplying the external air into the chamber via the first nozzle to cool the first organic layer.

Hereinafter, the manufacturing method of the display panel will be described in detail with reference to FIGS. 8A to 8E. In FIGS. 8A to 8E, the same or similar reference numerals denote the same or similar elements in FIGS. 1 to 7, and thus, detailed descriptions of the same or similar elements will be omitted.

Referring to FIG. 8A, the manufacturing method of the display panel DP (refer to FIG. 8E) may include the providing of the work substrate WS. The work substrate WS may include the carrier substrate CS and the first organic layer OL1 formed on the carrier substrate CS.

The first organic layer OL1 may be formed by coating the first organic material on the carrier substrate CS. The first organic material may be the precursor of the second organic material. In an embodiment, the first organic material may include the polyimide precursor, e.g., PAA.

Referring to FIGS. 8B and 8C, the manufacturing method of the display panel DP (refer to FIG. 8E) may include the forming of the second organic layer OL2 from the first organic layer OL1. In this case, the heat treatment process may be carried out using the heat treatment device HTD.

The forming of the second organic layer OL2 from the first organic layer OL1 may include the heating of the first organic layer OL1 and the cooling of the first organic layer OL1.

First, as shown in FIG. 8B, the heat treatment device HTD may operate in the first mode to heat the first organic layer OL1. That is, the heater part HTP may operate.

Simultaneously, the process gas PG may be supplied to the second connector C2 to provide the process gas PG into the chamber CB via the second nozzle N2. The inlet IT-C1 of the first connector C1 may be blocked by the valve VL, and the external air OA may not be supplied into the chamber CB.

The work material FM generated when the first organic layer OL1 is heated may be exhausted to the outside of the chamber CB via the air exhaust part EXP.

According to the disclosure, the work material FM may be prevented from entering the first nozzle N1 by the cover part CP disposed at the one end of the first nozzle N1. In addition, as the one end of the first nozzle N1 may protrude in the first direction DR1 than the one end of the second nozzle N2, the process gas PG may form the vortex in the first nozzle N1 and may increase the pressure in the first nozzle N1. Accordingly, the work material FM may be prevented from entering the first nozzle N1.

Then, as shown in FIG. 8C, the heat treatment device HTD may operate in the second mode and may cool the first organic layer OL1. That is, the operation of the heater part HTP may be stopped.

Simultaneously, the process gas PG may be supplied to the second connector C2, and the process gas PG may be provided into the chamber CB via the second nozzle N2. The inlet IT-C1 of the first connector C1 may be opened by controlling the valve VL, and thus, the external air OA may be supplied into the chamber CB via the first nozzle N1. Due to the external air OA, the temperature in the chamber CB and the temperature of the first organic layer OL1 may decrease.

A residual work material FM in the chamber CB may be exhausted to the outside of the chamber CB via the air exhaust part EXP.

In the process, the first organic material of the first organic layer OL1 may be converted to the second organic material, and the second organic layer OL2 may be formed from the first organic layer OL1. The second organic material may be polyimide ("PI").

According to the disclosure, the work material FM may not enter the first nozzle N1 during the first mode, and thus, the foreign substance formed by the work material FM and adhered to the first nozzle N1 may not exist in the first nozzle N1. Accordingly, during the second mode, a pollution level of the gas exhausted through the first nozzle N1 may be lowered, and a pollution level in the chamber CB may be lowered. Thus, the reliability and uniformity of the heat treatment process may increase, and the second organic layer OL2 may be formed with high reliability.

Figure 8D:
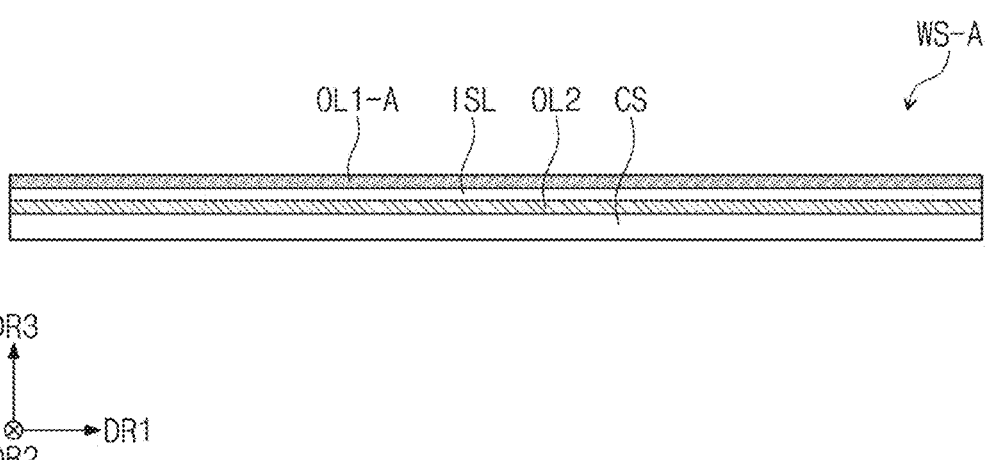

Referring to FIG. 8D, the manufacturing method of the display panel DP (refer to FIG. 8E) may further include forming an inorganic layer ISL and a first additional organic layer OL1-A on the second organic layer OL2.

In an embodiment, a work substrate WS-A may include the carrier substrate CS, the second organic layer OL2, the inorganic layer ISL, and the first additional organic layer OL1-A.

First, the inorganic layer ISL may be formed on the second organic layer OL2. The inorganic layer ISL may be formed by depositing an inorganic material. The inorganic layer ISL may have a single-layer or multi-layer structure.

Then, the first additional organic layer OL1-A may be formed on the inorganic layer ISL. The first additional organic layer OL1-A may be formed by coating the first organic material on the inorganic layer ISL. That is, the first additional organic layer OL1-A may include the same material as that of the first organic layer OL1.

Similar to the process of forming the second organic layer OL2 from the first organic layer OL1 described with reference to FIGS. 8C and 8D, a second additional organic layer OL2-A (refer to FIG. 8E) may be formed from the first additional organic layer OL1-A.

That is, the forming of the second additional organic layer OL2-A may include operating the heater part HTP (refer to FIG. 8B) to heat the first additional organic layer OL1-A and providing the external air OA (refer to FIG. 8C) to the chamber CB (refer to FIG. 8C) via the first nozzle N1 (refer to FIG. 8C) to cool the first additional organic layer OL1-A.

However, the forming of the inorganic layer ISL and the first additional organic layer OL1-A and the forming of the second additional organic layer OL2-A (refer to FIG. 8E) from the first additional organic layer OL1-A may be omitted.

Figure 8E:
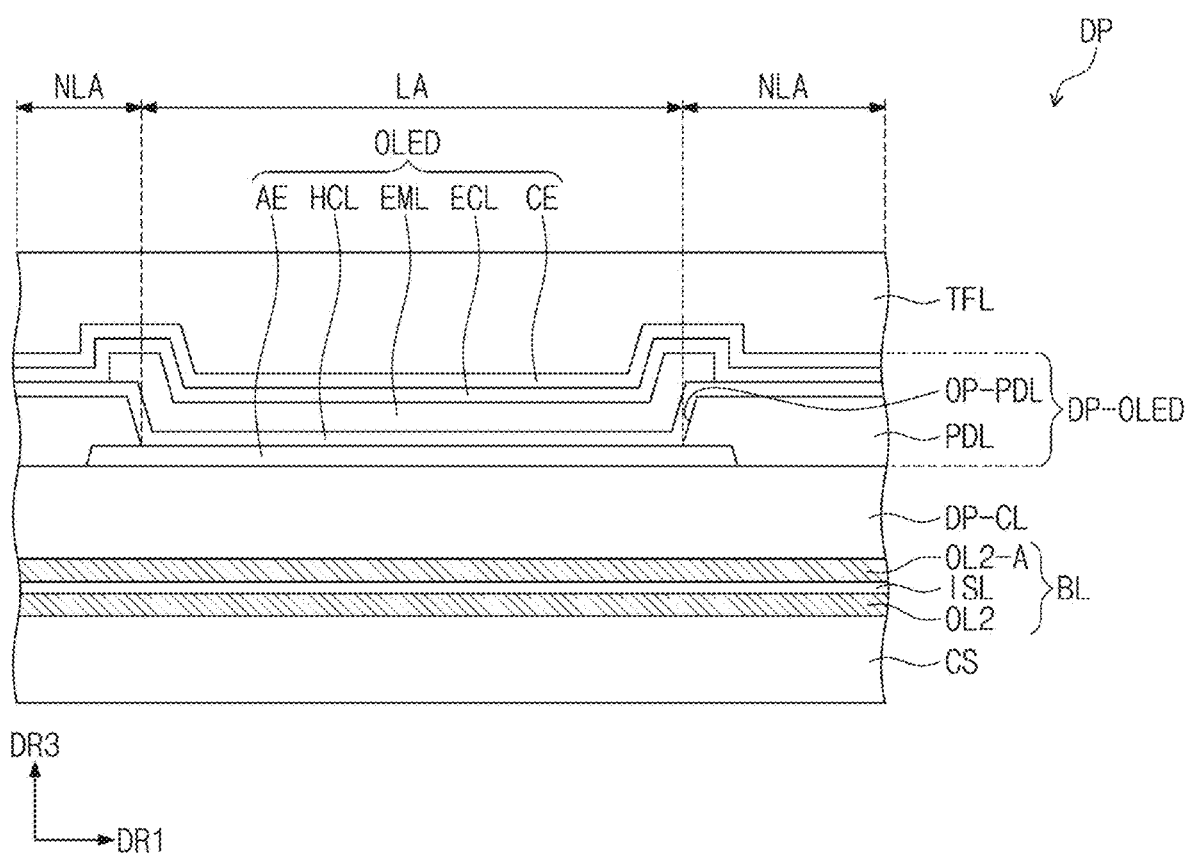

Referring to FIG. 8E, the manufacturing method of the display panel DP may further include forming a circuit element layer DP-CL and forming a light-emitting element layer DP-OLED. That is, the display panel DP may be formed using the work substrate WS-A (refer to FIG. 8D) to which the heat treatment process is applied.

FIG. 8E is a cross-sectional view of an embodiment of the display panel DP according to the disclosure. The display panel DP may be a light-emitting type display panel, e.g., an inorganic light-emitting display panel or an organic light-emitting display panel, however, it should not be particularly limited.

The display panel DP may include the base layer BL, the circuit element layer DP-CL, the light-emitting element layer DP-OLED, and an encapsulation layer TFL.

The base layer BL may correspond to the second organic layer OL2, the inorganic layer ISL, and the second additional organic layer OL2-A of the work substrate WS-A (refer to FIG. 8D) to which the heat treatment process is applied. The base layer BL may provide a base surface on which the circuit element layer DP-CL is disposed. The base layer BL may include the second organic layer OL2 and the second additional organic layer OL2-A, and thus, may have a flexible property to be bendable, foldable, or rollable.

The circuit element layer DP-CL may include at least one insulating layer and a circuit element. The circuit element may include a signal line and a driving circuit of a pixel. The circuit element layer DP-CL may be formed with a transistor and a capacitor by forming an insulating layer, a semiconductor layer, and a conductive layer using a coating or depositing process and by patterning the insulating layer, the semiconductor layer, and the conductive layer using a photolithography process.

The light-emitting element layer DP-OLED may include a pixel definition layer PDL and a light-emitting element OLED. The light-emitting element OLED may be an organic light-emitting diode or a quantum dot light-emitting diode.

A first electrode AE may be disposed on the circuit element layer DP-CL. At least a portion of the first electrode AE may be exposed via a light-emitting opening OP-PDL defined through the pixel definition layer PDL. The light-emitting opening OP-PDL of the pixel definition layer PDL may define a light-emitting area LA. A non-light-emitting area NLA may surround the light-emitting area LA.

A light-emitting layer EML may be disposed on the first electrode AE. The light-emitting layer EML may be provided in a pattern to correspond to the light-emitting opening OP-PDL, however, the disclosure should not be limited thereto or thereby. In an embodiment, the light-emitting layer EML may be commonly disposed in the light-emitting area LA and the non-light-emitting area NLA.

A second electrode CE may be disposed on the light-emitting layer EML. The second electrode CE may be commonly disposed in the light-emitting area LA and the non-light-emitting area NLA.

A hole control layer HCL may be disposed between the first electrode AE and the light-emitting layer EML. An electron control layer ECL may be disposed between the light-emitting layer EML and the second electrode CE. The hole control layer HCL and the electron control layer ECL may be commonly disposed in the light-emitting area LA and the non-light-emitting area NLA.

The encapsulation layer TFL may be disposed on the light-emitting element OLED. The encapsulation layer TFL may include a plurality of thin layers. The thin layers may include an inorganic layer and an organic layer. The encapsulation layer TFL may include an insulating layer to encapsulate the light-emitting element layer DP-OLED and an insulating layer to improve a light-emitting efficiency.

Then, the display device may be manufactured by further forming other functional layers on or under the display panel DP. The functional layers may be formed while the carrier substrate CS is attached or may be formed after the carrier substrate CS is removed.

Although the embodiments of the disclosure have been described, it is understood that the disclosure should not be limited to these embodiments but various changes and modifications may be made by one ordinary skilled in the art within the spirit and scope of the disclosure as hereinafter claimed. Therefore, the disclosed subject matter should not be limited to any single embodiment described herein, and the scope of the inventive concept shall be determined according to the attached claims.

What is claimed is:

1. A heat treatment device comprising:
a chamber accommodating a work substrate comprising a first organic layer;
a heater part which is disposed in the chamber and heats the work substrate;
an air supply part comprising:
a first nozzle which supplies an external air to the chamber;
a second nozzle which is disposed in the first nozzle and supplies a process gas to the chamber; and
a cover part through which an opening overlapping the second nozzle is defined and which is disposed at an end of the first nozzle which is adjacent to an outlet of the first nozzle; and
an air exhaust part which exhausts particles in the chamber to an outside of the chamber,
wherein the opening is defined only at a central portion of the cover part, and no other openings are defined in a remaining portion of the cover part.

2. The heat treatment device of claim 1, wherein the second nozzle is spaced apart from the cover part at a predetermined distance in a direction in which the second nozzle extends in a cross-section.

3. The heat treatment device of claim 1, wherein the second nozzle comprises an outlet disposed in the opening and spaced apart from an inner side surface of the cover part, which defines the opening.

4. The heat treatment device of claim 1, wherein the opening has a circular shape or a polygonal shape in a plan view.

5. The heat treatment device of claim 1, wherein the cover part comprises:

a first cover part defining the opening; and a second cover part disposed in the opening and having a mesh shape in a plan view.

6. The heat treatment device of claim 1, wherein the cover part extends from the end of the first nozzle to a direction inclined with respect to a direction in which the first nozzle extends, and the cover part has a diameter decreasing as a distance from the end of the first nozzle increases.

7. The heat treatment device of claim 1, wherein the cover part comprises:

a first sub-portion extending from the end of the first nozzle to a direction substantially perpendicular to a direction in which the first nozzle extends and covering a portion of the outlet of the first nozzle in a cross-section; and a second sub-portion extending from the first sub-portion to a direction away from the outlet of the first nozzle.

8. The heat treatment device of claim 1, wherein each of the first nozzle, the second nozzle, and the cover part is provided in plural, and the air supply part further comprises:

a first connector connected to an inlet of each of first nozzles; and a second connector connected to an inlet of each of second nozzles and surrounded by the first connector.

9. The heat treatment device of claim 8, wherein the air supply part further comprises a valve disposed at an end adjacent to an inlet of the first connector.

10. The heat treatment device of claim 8, wherein the air supply part further comprises a filter disposed at the inlet of the first connector.

11. The heat treatment device of claim 8, wherein the chamber is provided with sidewall openings defined through a sidewall thereof, the first nozzles are respectively inserted into the sidewall openings, and each of the first connector and the second connector is disposed outside the chamber and is disposed adjacent to the sidewall through which the sidewall openings are defined.

12. The heat treatment device of claim 1, wherein the process gas comprises an inert gas.

13. The heat treatment device of claim 1, wherein the cover part is coupled with the end of the first nozzle by a welding process.

14. The heat treatment device of claim 1, wherein the heater part is operated in a first mode, the air supply part supplies only the process gas to the chamber in the first mode, the heater part is not operated in a second mode, and the air supply part supplies the process gas and the external air to the chamber in the second mode.

15. The heat treatment device of claim 14, wherein the work substrate further comprises a carrier substrate disposed under the first organic layer, and the first organic layer is converted to a second organic layer after the first mode and the second mode are sequentially performed.

16. The heat treatment device of claim 15, wherein the second organic layer comprises polyimide.

17. The heat treatment device of claim 1, wherein the air supply part further comprises a nozzle supporter disposed in the first nozzle and fixing the second nozzle.

* * * * *